United States Patent [19]

Kwag et al.

[11] Patent Number: 6,140,233
[45] Date of Patent: Oct. 31, 2000

[54] METHOD OF MANUFACTURING SEMICONDUCTOR DEVICES, ETCHING COMPOSITIONS FOR MANUFACTURING SEMICONDUCTOR DEVICES, AND SEMICONDUCTOR DEVICES THEREBY

[75] Inventors: Gyu-hwan Kwag, Suwon; Se-jong Ko, Twasung-gun; Kyung-seuk Hwang, Suwon; Jun-ing Gil, Hwasung-gun; Sang-o Park, Osan; Dae-hoon Kim, Yongin; Sang-moon Chon, Sungnam; Ho-Kyoon Chung, Yongin, all of Rep. of Korea

[73] Assignee: Samsung Electronics Co., Ltd., Suwon, Rep. of Korea

[21] Appl. No.: 09/109,922

[22] Filed: Jul. 2, 1998

[30] Foreign Application Priority Data

Jun. 25, 1998 [KR] Rep. of Korea ............. 98-24232

[51] Int. Cl.[7] .................................. H01L 21/44
[52] U.S. Cl. .................. 438/669; 438/672; 438/685; 438/745; 438/748; 438/754; 216/88; 216/92; 216/100; 216/108; 216/109
[58] Field of Search ................... 438/669, 672, 438/685, 745, 748, 754; 216/88, 92, 100, 108, 109

[56] References Cited

U.S. PATENT DOCUMENTS 5,486,234  1/1996  Contolini et al. ................ 216/91
5,942,449  8/1999  Meikle ........................... 438/747

*Primary Examiner*—John F. Niebling
*Assistant Examiner*—David A Zarneke
*Attorney, Agent, or Firm*—Jones Volentine, LLC

[57] ABSTRACT

A method of manufacturing semiconductor devices is provided for forming a tungsten plug or polysilicon plug and minimizing the step-height of the intermediate insulating layer. An etching composition for this process is also provided as are semiconductor devices manufactured by this process. The method of manufacturing semiconductor devices includes the steps of forming a tungsten film having a certain thickness on an insulating layer and burying contact holes formed in the insulating layer constituting a specific semiconductor structure, and spin-etching the tungsten film using a certain etching composition such that the tungsten film is present only inside the contact holes not existing on the insulating film. The etching composition includes at least one oxidant selected from the group comprising $H_2O_2$, $O_2$, $IO_4^-$, $BrO_3$, $ClO_3$, $S_2O_8^-$, $KlO_3$, $H_5IO_6$, KOH, and $HNO_3$, at least one enhancer selected from the group comprising HF, $NH_4OH$, $H_3PO_4$, $H_2SO_4$, and HCl, and a buffer solution formed by mixing them at certain rates.

32 Claims, 12 Drawing Sheets

METHOD OF MANUFACTURING SEMICONDUCTOR DEVICES, ETCHING COMPOSITIONS FOR MANUFACTURING SEMICONDUCTOR DEVICES, AND SEMICONDUCTOR DEVICES THEREBY

FIELD OF THE INVENTION

The present invention relates to fabrication processes for semiconductor devices, and more particularly, to a method of manufacturing semiconductor devices for providing the formation of tungsten plugs and polysilicon plugs, and for minimizing the step-height differences of intermediate insulating layers by etching thin films on the semiconductor substrate using a specific etching composition and spin etching method, and to an etching composition for manufacturing semiconductor devices, and semiconductor devices made by these processes.

DESCRIPTION OF THE RELATED ART

Recently, with semiconductor devices becoming more highly-integrated, there is an increased demand for the fine pattern formation technology of semiconductor devices and the multi-layered structure of circuit distribution.

In other words, the surface structure of the semiconductor devices are becoming more complicated, and the step-height differences between layers can cause malfunctions in the fabrication process of semiconductor devices.

Among the various fabrication processing steps, photolithography is used to form a photoresist pattern on the semiconductor substrate by coating a wafer with photoresist, aligning the wafer and a pattern mask having circuit distributions, and carrying out an exposure process by irradiating the photoresist on the wafer with light shining through the mask.

In the conventional fabrication method, the relatively-large Critical Dimension and the low-layered structure of the semiconductor devices cause few problems. However, with the finer patterns used on semiconductor substrates these days, and their multi-layered structures, it is more difficult to exactly focus between the upper position and the lower position of the step-height difference in the exposure process, so that the precise pattern formation is hard to achieve.

Therefore, in order to minimize the step-height difference, the planarization technology of wafers has become more important. Conventionally, "partial planarization" has been employed for the planarization of wafers, using such methods as SOG film deposition, Etch Back, or Reflow, etc., which do not address the above problems and furthermore, cause many additional problems. As a result, "global planarization" called the Chemical Mechanical Polishing (CMP) method has been developed as a planarization process that operates throughout the whole surface of the wafer.

The CMP method planarizes the wafer surface by means of chemical and physical reaction, that is, by supplying a slurry as a thin film on a surface of the wafer having a pattern formed thereon, contacting the wafer with the polishing pad surface, causing a chemical reaction on the wafer surface, and simultaneously allowing the uneven wafer surface to be physically polished by rotating the wafer to achieve planarization.

The removal rate and the uniformity of planarization are important parameters in the CMP technology, and these are determined by the processing conditions of the CMP facility, slurry types, and polishing pad types, etc. In particular, the components, pH, and ion concentration of the slurry greatly affect the chemical reaction of the thin film.

The slurry is mainly divided into two types, oxide film slurry and metal film slurry. The oxide film slurry is alkali, and the metal film slurry is acidic.

In the case where silicon dioxide ($SiO_2$) is planarized using an oxide film CMP process, the property of the silicon dioxide ($SiO_2$) is changed into hydrophillic subject to $H_2O$ permeability by the reaction with alkali slurry. The water intruded into the silicon dioxide ($SiO_2$) disconnects the connection chains of the silicon dioxide ($SiO_2$). Then, the silicon dioxide ($SiO_2$) is removed by the physical mechanism with the abrasive.

In the case of metal film CMP process, however, the chemical reaction on the surface of the metal film by oxidant inside the slurry creates a metal oxide film, and the metal oxide film is removed by the mechanical (physical) friction of the abrasive starting with the outermost layer of the uneven pattern.

FIG. 1 is a schematic diagram showing a conventional CMP apparatus for manufacturing semiconductor devices.

Referring to FIG. 1, the CMP apparatus comprises a polishing head 102, a polishing table 104, and a polishing pad 108. The CMP process is carried out on the polishing table 104. The polishing pad 108 is formed on the polishing table and holds a semiconductor substrate 100. A slurry is then supplied from a slurry supply line 106 and is used to polish the substrate 100. The polishing head 102 secures the substrate 100 to the polishing pad and is movable in a rotational direction.

In operation, the polishing pad 108 contacts with the semiconductor substrate 100. The semiconductor substrate 100 is then rotated by the polishing head 102, and the slurry is supplied on the grinding pad 108. The slurry and the surface of the semiconductor substrate 100 then react each other, which causes the substrate to be polished by the polishing pad 108.

FIG. 2 to 7 are cross sectional views for manufacturing semiconductor devices in order to describe the conventional processing sequences of a tungsten plug formation. The tungsten plug portion and an align mark during the tungsten plug formation are shown simultaneously.

FIGS. 2 to 7 are divided into a cell portion (C) for the formation of the pattern element and a peripheral portion (P) for the formation of the align mark, etc.

First, as shown in FIG. 2, an oxide film 114 is formed as an insulator on a semiconductor substrate 110 having a plurality of local patterns 112 preformed apart from each other. The local pattern 112 can use a polysilicon pattern or a metal pattern as a conductive layer. The oxide film 114 is a silicon dioxide film ($SiO_2$) formed by a conventional Chemical Vapour Deposition process. Phosphosilicate (PSG) or Borophosphosilicate (BPSG) is used as an insulating layer between the polysilicon pattern and the metal film. The oxide film 114 is formed on the align mark portion (not shown).

Then, as shown in FIG. 3, in the planarization step of the oxide film 114, the oxide film 114, which is uneven by the local pattern 112, is planarized using the CMP apparatus shown in FIG. 1.

Then, as shown in FIG. 4, in the formation of contact hole 116, the contact hole 116 is formed via a typical photolithography and etch process by coating the oxide film 114 with photoresist and exposing the local pattern 112 and the semiconductor substrate 110. At this time, contact holes for forming the align mark 118 are formed with a diameter bigger than that of the contact hole 116.

Then, as shown in FIG. 5, in the formation of a barrier metal film 120, a titanium/titanium nitride (Ti/TiN) film is formed on the contact hole 116 as a barrier metal film 120 before forming a tungsten film. The Ti film 120a is formed using a conventional sputtering method. The TiN film 120b is formed using a conventional sputtering or a Chemical Vapour Deposition (CVD) method, and is not limited to either one or the other method. The barrier metal film 120 reduces the contact resistance of the tungsten film, and improves the adhesiveness of the oxide film 114 and the tungsten film. In addition, during a later process for removing the tungsten film, the barrier metal film 120 is used as stopper layer. At this time, the barrier metal layer 120 can be formed on the align mark 118.

Then, as shown in FIG. 6, in the formation of tungsten film 122, a tungsten film 122 is formed on the oxide film 114 having a certain thickness burying the contact hole 116. At this time, the tungsten film 122 is formed inside the align mark 118. Since the align mark 118 has a bigger diameter than that of the contact hole 116 of the cell part, the align mark 118 is not buried with the tungsten film 122, but has its bottom and sidewalls covered.

Then, as shown in FIG. 7, in the removal of the tungsten film 122, the semiconductor substrate 110 having the tungsten film 122 formed thereon is fixed on the polishing head 102 of the CMP apparatus of the FIG. 1, and the polishing pad 108 comes in contact with the tungsten film 112 while the metal film slurry is supplied from the slurry supply line 106. The grinding head 102 is then rotated to remove the tungsten film 112 on the barrier metal film 120 such that a portion 123 of the tungsten film 122 remains only inside the contact hole 116. At this time, a portion 123 of the tungsten film still remains on the bottom and sidewalls of the align mark 118. The remaining tungsten film 123 on the align mark 118 function as particles in the following process thereby reducing the aligning ability of the photolithography process.

The CMP process for the formation of the tungsten plug is essential for the highly-integrated semiconductor devices fabrication process, but the CMP process causes microscratches on the thin film through the CMP process according to the slurry or the polishing apparatus of the CMP process. Furthermore, the slurry still remains on the align mark at a thickness of 2 to 4 times of the diameter of the contact hole, and on the scribe line portions so that they function as a particle source in later processes, thereby deteriorating the alignability of the photolithography process.

The tungsten plug formation process should be always conducted after the planarization of the insulating layer. Therefore, later processing, and frequently-conducted tests result in increased expenses due to the wafer monitor and the exchange of the expensive facilities. The tests conducted may be, e.g., to prevent the decrease of the productivity and maintain the CMP processing quality In addition, the abrasion of the polishing apparatus and the high pressure applied by the polishing head on the wafer for polishing frequently causes the wafer being polished to break.

Furthermore, the facility efficiency can be deteriorated because the polishing of dummy wafers required to readjust the processing conditions after the exchange of the facility takes a long time.

In addition, the dry each back process used during the formation of the tungsten plug increases the contact resistance and the electrical heating for transistors because of the electrical charge-up of plasma according to intricate patterns.

Therefore, a demand has arisen to develop a method to address the above problems, and to provide a processing method carried out with more ease and efficiency, and to improve productivity.

SUMMARY OF THE INVENTION

There is provided a method of manufacturing semiconductor devices including a formation process of a tungsten plug or a polysilicon plug that omits a planarization process of intermediate insulating layers, and preventing the occurrence of the micro-scratches on the surface and the increase of the contact resistance. There is also provided a formation process of insulating layers for minimizing the step-height difference of the pattern on a semiconductor substrate. These methods substantially obviate one or more of the problems caused by the limitations and the disadvantages of the related art.

Another object of the present invention is to provide an etching method and an etching composition for effectively etching a tungsten film, a polysilicon film and an oxide film in horizontal direction.

To achieve these and other advantages and in accordance with the purpose of the present invention as embodied and broadly described, a method of manufacturing semiconductor devices comprises the steps of forming an insulator film over a semiconductor substrate; forming one or more contact holes in the insulator film; forming a tungsten film over the insulating layer and in the one or more contact holes; and spin-etching the tungsten film using an etching composition to remove a portion of the tungsten film outside of the one or more contact holes.

The contact hole is formed on a certain conductive layer on a semiconductor substrate, or is formed directly on a semiconductor substrate.

The method further comprises a step of forming a barrier metal film on the semiconductor structure including the contact hole before forming a tungsten film on the semiconductor structure. Preferably, the barrier metal film is Ti, TiN, or Ti/TiN.

The etching composition comprises at least one oxidant selected from the group consisting of $H_2O_2$, $O_2$, $IO_4^-$, $BrO_3$, $ClO_3$, $S_2O_8^-$, $KlO_3$, $H_5IO_6$, $KOH$, and $HNO_3$, at least one enhancer selected from the group comprising HF, $NH_4OH$, $H_3PO_4$, $H_2SO_4$, and HCl, and a buffer solution.

The etching composition comprises $HNO_3$ as an oxidant and a 0.01 to 3.0 mole ratio of HF as an enhancer. Most preferably, the etching composition comprises $HNO_3$ as an oxidant and a 0.05 to 2.0 mole ratio of HF as an enhancer.

The etch rate of the etching composition for the tungsten film is in the range of 400 to 9000Å/min.

The etching composition may also comprise $H_2O_2$ as an oxidant and a 0 to 30 mole ratio of $NH_4OH$ as an enhancer. In this case, the etching composition most preferably comprises $H_2O_2$ as an oxidant and a 0 to 15 mole ratio of $NH_4OH$ as an enhancer.

The etch rate of the etching composition for the tungsten film is in the range of 200 to 3000Å/min.

The processing temperature of the etching composition during the spin-etching step is in the range of 20 to 90° C., and preferably, the spin etch is carried out by a spin-spray method.

The spray amount of the etching solution is in the range of 0.1 to 2.5 l/min, and the boom swing of a nozzle for spraying the etching composition is in the range of −80 to 80.

The rotation speed of a spin chuck used in the spin-spray method is in the range of 200 to 5000 rpm.

Preferably, the spin-etch for the tungsten film is carried out with two steps.

Another method of manufacturing semiconductor devices is provided, comprising the steps of forming an insulator film over a semiconductor substrate; forming one or more contact holes in the insulator film; forming a tungsten film over the insulating layer and in the one or more contact holes; carrying out a first spin-etching of the tungsten film to remove 40 to 95% of the thickness of the tungsten film by using a first etching composition having a high etch rate; and carrying out a second spin-etching of the tungsten film to remove an additional portion of the tungsten film outside of the one or more contact holes, by using a second etching composition having a lower etch rate than the first etching composition.

In another aspect, a method of manufacturing semiconductor devices comprises the steps of forming an insulating layer film over a semiconductor substrate; forming one or more contact holes in the insulating layer; forming a polysilicon film over the insulating layer and in the one or more contact holes; and spin-etching the polysilicon film using an etching composition to remove a portion of the polysilicon film outside of the one or more contact holes.

The contact hole is formed on a certain conductive layer on a semiconductor substrate, or the contact hole is directly formed on a semiconductor substrate.

The etching composition comprises at least one oxidant selected from the group comprising $H_2O_2$, $O_2$, $IO_4^-$, $BrO_3$, $ClO_3$, $S_2O_8^-$, $KIO_3$, $H_5IO_6$, KOH, and $HNO_3$, at least one enhancer selected from the group comprising HF, $NH_4OH$, $H_3PO_4$, $H_2SO_4$, and HCl, and a buffer solution.

The etching composition comprises $HNO_3$ as an oxidant and a 0.001 to 2.0 mole ratio of HF as an enhancer. Most preferably, the etching composition comprises $HNO_3$ as an oxidant and a 0.005 to 0.05 mole ratio of HF as an enhancer.

The etch rate of the etching composition is in the range of 1000 to 15000 Å/min.

The processing temperature of the etching composition during the spin-etching step is in the range of from 20 to 90° C., and preferably, the spin etch is carried out by a spin-spray method.

The spray amount of the etching solution is 0.1 to 2.5 l/min., and the boom swing of a nozzle for spraying the etching composition is in the range of −80 to 80.

The rotation speed of a spin chuck used in the spin-spray method is in the range of 200 to 5000 rpm.

A method of manufacturing semiconductor devices comprises the steps of forming a lower structure on a semiconductor substrate having lower height; forming an upper structure on a semiconductor substrate having an upper height greater than the lower height; forming a intermediate insulating layer over the upper and lower structures; and spin-etching the intermediate insulating layer using a etching composition to achieve planarization of the intermediate insulating layer, wherein a step height difference is equal to the difference between the upper and lower heights, and wherein the intermediate insulating layer is thicker than the step-height difference.

The intermediate insulating layer is an oxide film.

The etching composition comprises at least one oxidant selected from the group comprising $H_2O_2$, $O_2$, $IO_4^-$, $BrO_3$, $ClO_3$, $S_2O_8^-$, $KIO_3$, $H_5IO_6$, KOH, and $HNO_3$, at least one enhancer selected from the group comprising HF, $NH_4OH$, $H_3PO_4$, $H_2SO_4$, and HCl, and a buffer solution.

The etching composition comprises $HNO_3$ as an oxidant and a 0.01 to 3.0 mole ratio of HF as an enhancer. Most preferably, the etching composition comprises $HNO_3$ as an oxidant and a 0.05 to 1.0 mole ratio of HF as an enhancer.

The etch rate of the etching composition is in the range of 1000 to 25000 Å/min.

The processing temperature of the etching composition during the spin-etching step is in the range of 20 to 90° C., and the spin etch is carried out by a spin-spray method.

Preferably, the spray amount of the etching solution is in the range of 0.1 to 2.5 l/min.

The boom swing of a nozzle for spraying the etching composition is in the range of −80 to 80, and the rotation speed of a spin chuck used in the spin-spray method is in the range of 200 to 5000 rpm.

An etching composition for manufacturing semiconductor devices comprises at least one oxidant selected from the group comprising $H_2O_2$, $O_2$, $IO_4^-$, $BrO_3$, $ClO_3$, $S_2O_8^-$, $KIO_3$, $H_5IO_6$, KOH, and $HNO_3$, at least one enhancer selected from the group comprising HF, $NH_4OH$, $H_3PO_4$, $H_2SO_4$, and HCl, and a buffer solution.

The etched material is a tungsten film, a polysilicon film, or an oxide film, and the buffer solution is deionized water for controlling concentration, temperature and the resulting contact angle of the etching composition.

According to the present invention, an etching composition for manufacturing semiconductor devices for spin-etching a certain material on a semiconductor substrate comprises $HNO_3$ as an oxidant and a 0.001 to 3.0 mole ratio of HF as an enhancer.

The etched material by the etching composition is a tungsten film, a polysilicon film, or an oxide film.

In another aspect, an etching composition of the present invention for manufacturing semiconductor devices for spin-etching a certain material on a semiconductor substrate comprises $H_2O_2$ as an oxidant and a 0 to 30 mole ratio of $NH_4OH$ as an enhancer.

The etched material by the etching composition is a tungsten film.

In another aspect, according to the present invention, a semiconductor device comprising a cell portion formed on a semiconductor substrate, having one or more metal film plugs formed in one or more contact holes to electrically connect a plurality of patterns; a peripheral portion surrounding the cell portion and including at least one align mark formed by the same formation method as the one or more contact holes; and an insulating layer formed over the cell portion and the peripheral portion.

Preferably, the metal film is a tungsten film.

It is to be understood that both the foregoing general description and the following detailed description are exemplary and explanatory and are intended to provide further explanation of the invention as claimed.

DETAILED DESCRIPTION OF THE PREFERRED EMBODIMENT

Figure 1:
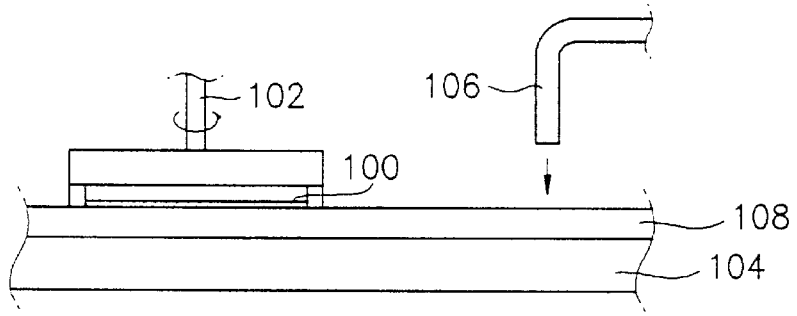
FIG. 1 is a schematic representation showing a conventional CMP apparatus for manufacturing semiconductor devices.
Figure 2:
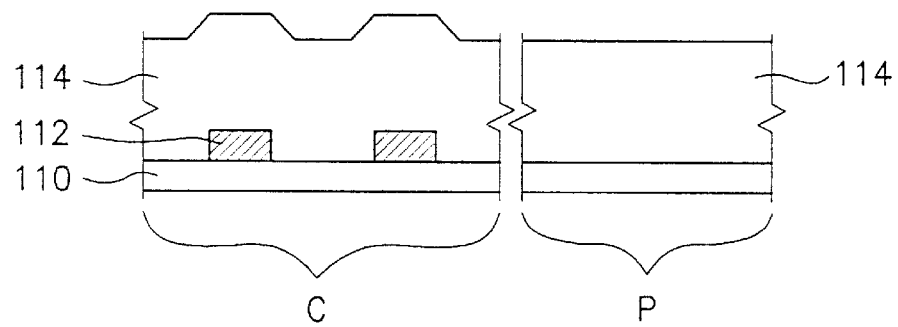
FIGS. 2 to 7 are cross sectional views for manufacturing semiconductor devices, describing the conventional processing sequences of a tungsten plug formation process.
Figure 3:
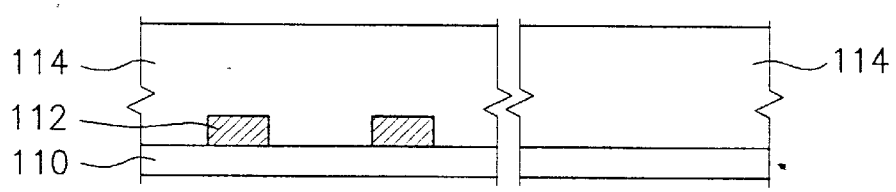
Figure 4:
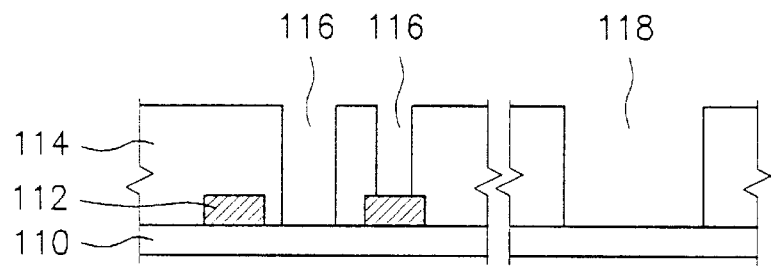
Figure 5:
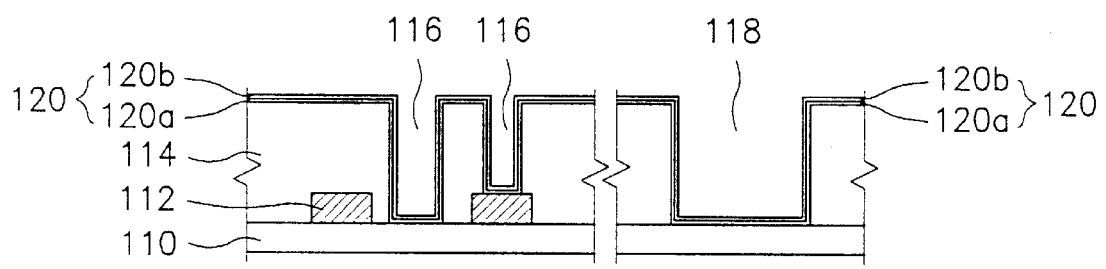
Figure 6:
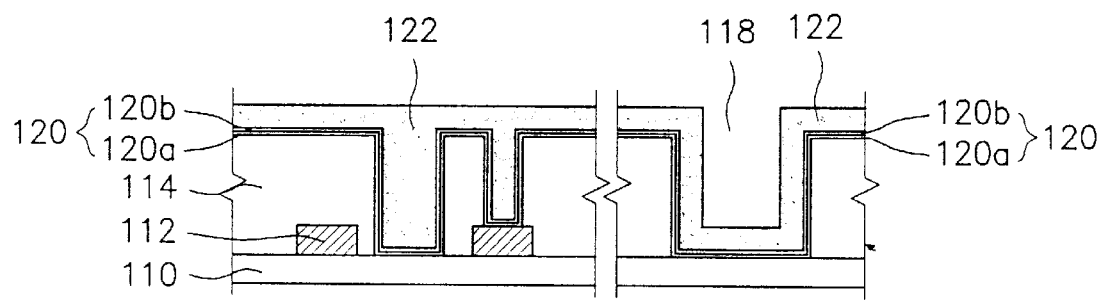
Figure 7:
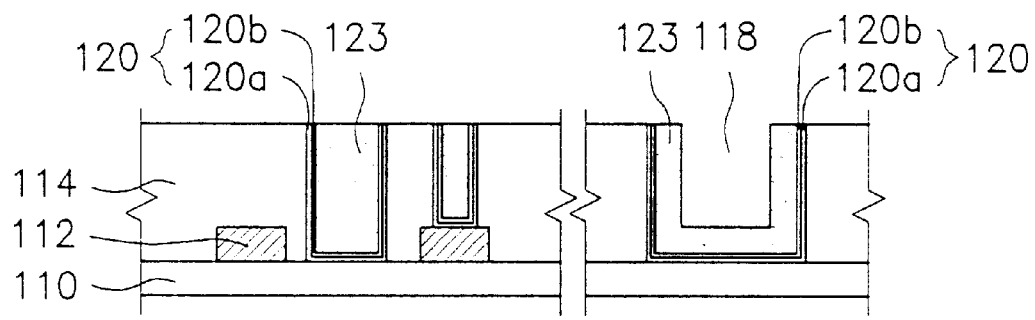

The present invention will now be described more fully below with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

According to the present invention, there is provided a method of manufacturing semiconductor devices including a formation process of a tungsten plug and a polysilicon plug, for omitting a planarization process of intermediate insulating layers, and for preventing the occurrence of the microscratches on the surface to increase the contact resistance. A formation process of insulating layers for minimizing the step-height difference of the pattern on the semiconductor substrate is also provided.

In addition, the present invention provides an etching method and an etching composition for effectively etching a tungsten film, a polysilicon film, and an oxide film in a horizontal direction.

The etching composition for spin-etching a certain material on a semiconductor substrate in the semiconductor devices fabrication process according to the present invention preferably comprises at least one oxidant selected from the group consisting of $H_2O_2$, $O_2$, $IO_4^-$, $BrO_3$, $ClO_3$, $S_2O_8^-$, $KlO_3$, $H_5IO_6$, KOH, and $HNO_3$, at least one enhancer selected from the group consisting of HF, $NH_4OH$, $H_3PO_4$, $H_2SO_4$, HCl, and a buffer solution made by a mixture of these compositions. The etched material can be a tungsten film, a polysilicon film, or an oxide film. The buffer solution is used in order to control the concentration, temperature and contact angle of the etching composition, and deionized water is preferably used.

The etching composition of the present invention most preferably comprises $HNO_3$ as an oxidant, and a 0.001 to 3.0 mole ratio of HF as an enhancer. The thin film etched by the etching composition is preferably a polysilicon film, a metal film, or an oxide film.

Another etching composition according to the present invention preferably comprises $H_2O_2$ as an oxidant, and a 0 to 30 mole ratio of $NH_4OH$ as an enhancer. The thin film etched by this etching composition is preferably a metal film.

A method of manufacturing semiconductor devices using the etching composition will be described below, but the present invention should not be construed to be limited to the following embodiments.

First Preferred Embodiment

A first preferred embodiment of the method of manufacturing semiconductor devices to form the tungsten plug is now described. This embodiment allows the omission of the step of planarization of the intermediate insulating film and prevents the occurrence of surface microscratches and an increase in contact resistance.

First, the tungsten plug formation process is carried out by forming a tungsten film having a certain thickness on an insulating layer burying contact holes formed in the insulating layer constituting a specific semiconductor structure. Then, by spin-etching the tungsten film using a certain etching composition, a tungsten film is formed to be present only inside the contact holes and not existing on the insulating film.

The tungsten plug serves to connect the conductive film of the lower layer and the metal circuits of the upper layer after forming contact holes on the insulating layer and burying tungsten film in the contact holes.

Therefore, the tungsten plug serves as an ohmic contact between the contact holes and as an inner electrical connection between devices.

The contact holes are formed on a certain conductive layer on a semiconductor substrate, or are directly formed on the semiconductor substrate.

Before forming the tungsten film on the semiconductor structure, the method can further comprise a step of forming a barrier metal film on the whole surface of the semiconductor structure including the contact holes. The barrier metal film is preferably Ti, TiN, or Ti/TiN.

The etching composition comprises at least one oxidant selected from the group consisting of $H_2O_2$, $O_2$, $IO_4^-$, $BrO_3$, $ClO_3$, $S_2O_8^-$, $KlO_3$, $H_5IO_6$, KOH, and $HNO_3$ at least one enhancer selected from the group consisting of HF, $NH_4OH$, $H_3PO_4$, $H_2SO_4$, and HCl, and a buffer solution made by mixing these compositions at certain rates. The first etching composition for the tungsten film etch preferably comprises $HNO_3$ as an oxidant, and a 0.01 to 3.0 moles ratio of HF as an enhancer, and most preferably, comprises $HNO_3$ as an oxidant, and a 0.05 to 2.0 mole ratio of HF as an enhancer.

The etch rate of the tungsten film by the first etching composition is preferably in the range of from 400 to 9000Å/min.

The second etching composition for the tungsten film etch preferably comprises $H_2O_2$ as an oxidant, and a 0 to 30 mole ratio of $NH_4OH$ as an enhancer, and most preferably, comprises $H_2O_2$ as an oxidant, and a 0 to 15 mole ratio of $NH_4OH$ as an enhancer.

The etch rate of the tungsten film by the second etching composition is preferably in the range of from 200 to 3000 Å/min. The precessing temperature of the etching composition during the spin-etching step is preferably in the range of from 20 to 90° C., and the spin-etch can be carried out by a Spin Spray method. The spray amount of the etching composition in this method is preferably 0.1 to 2.5 l/min, and the boom swing of the nozzle is preferably in the range of from −80 to 80.

The boom swing is a measurement in mm of the movement range of the nozzle as it moves over the semiconductor substrate spraying the etching composition. The left side is designated as negative (−), and the right side is designated as positive (+), centering on the center of the semiconductor substrate. The boom swing of the present invention is preferably in the range of from −80 to 80. This means that the nozzle sprays the etching composition while moving 80 mm to each of the left/right sides of the center of the semiconductor substrate. The boom swing should be optimized because the boom swing is a parameter that affects the uniformity of the thin films to be etched and the etch rate. The rotation speed of the spin chuck while spraying the etching composition is preferably 200 to 5000 rpm.

In the spin-spray method, a semiconductor substrate to be etched is placed on a rotatable spin chuck, which is then rotated at a certain speed. The etching composition is then sprayed through a nozzle located over the semiconductor substrate so as to remove the tungsten film on the semiconductor substrate. In other words, the etch momentum in the horizontal direction of the tungsten film is increased by the centrifugal force of the semiconductor substrate on the rotated spin chuck, and the etching composition has a good reactivity with the tungsten film. As a result of this, the surface of the semiconductor substrate is grinded during processing. The faster the rotation of the spin chuck is, the greater the etch momentum.

As a result of this, the etch rate and the uniformity of the tungsten film are improved, and voids which can be present on the tungsten film can be removed.

The spin-etch of the tungsten film is preferably carried out with at least two steps, that is, a first etch step and a second etch step. The first etch step is preferably carried out by performing a first etch to remove 40 to 95% of the thickness of the tungsten film by using an etching composition having a high etch rate. The second etch step is preferably carried out by performing a second etch to remove the remaining portions of the tungsten film by using an etching composition having a lower etch rate than that used in the first etch step.

The etching composition used in the first etch step preferably comprises $HNO_3$ as an oxidant, and a 0.01 to 3.0 mole ratio of HF as an enhancer. The etching composition used in the second etch step preferably comprises $H_2O_2$ as an oxidant, and a 0 to 30 mole ratio of $NH_4OH$ as an enhancer.

Figure 8:
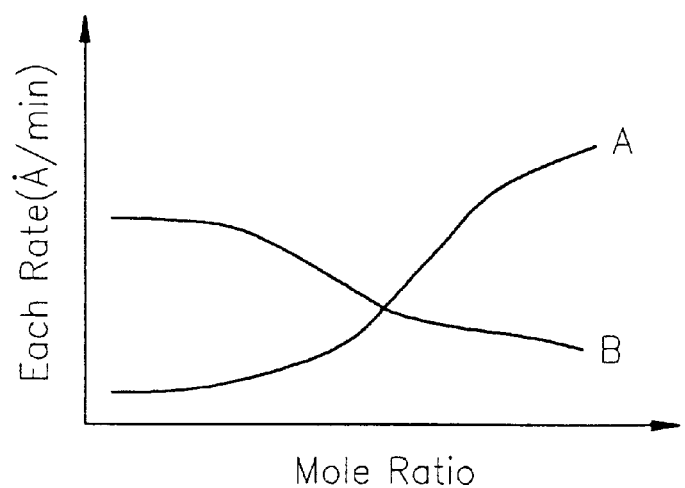
FIG. 8 is a graphical representation showing the etch rate of the etching composition for a tungsten film by Mole Ratio.

FIG. 8 is a graphical representation showing the etch rate of the etching composition for the tungsten film by mole ratio.

The line A shows a result for the first etching composition, comprising $HNO_3$ as an oxidant, and a 0.01 to 3.0 mole ratio of HF as an enhancer. As shown in FIG. 8, the greater the mole ratio for this first etching composition, the higher the etch rate is.

The line B shows a result for the second etching composition, comprising $H_2O_2$ as an oxidant, and a 0 to 30 mole ratio of $NH_4OH$ as an enhancer. As shown in FIG. 8, the greater the mole ratio for this second etching composition, the lower the etch rate is.

Figure 9:
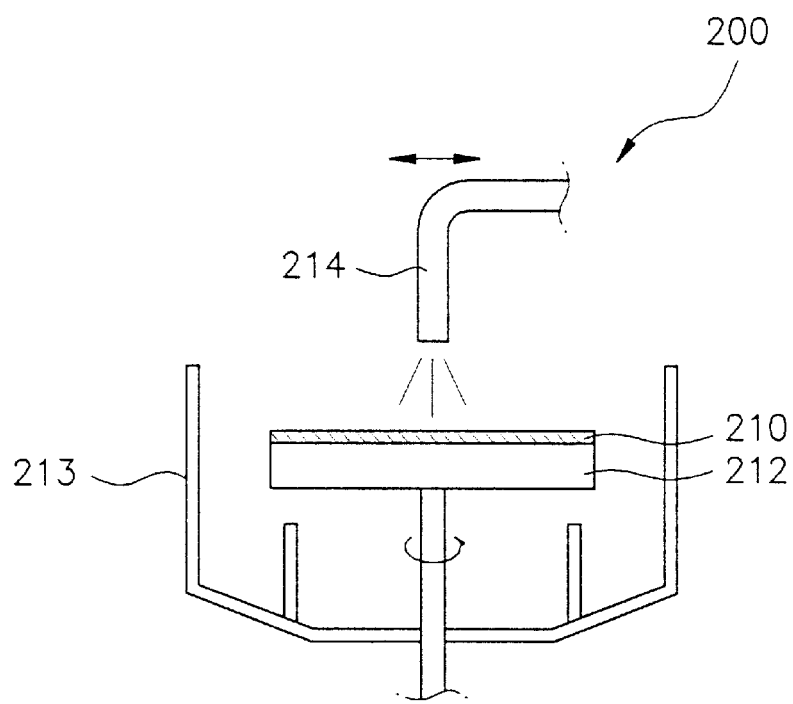
FIG. 9 is a schematic representation showing a spin spray apparatus used to carry out a fabrication process of semiconductor device according to a first preferred embodiment of the present invention.

FIG. 9 is a schematic representation showing a spin spray apparatus in order to carry out the fabrication process of semiconductor devices according to a first preferred embodiment of the present invention.

As shown in the FIG. 9, a spin chuck 212 placed under the semiconductor substrate 210, and an etching composition nozzle 214 is placed over the semiconductor substrate 210. The nozzle 214 moves to the left/right, and sprays the etching composition over the semiconductor substrate 210. The spin spray apparatus 200 can be any conventional model, and a cleaning solution nozzle (not shown) is preferably installed next to the etching composition nozzle 214.

In addition, a bowl 213 is provided for covering the spin chuck 212 and for preventing the etching composition from flowing out during the process.

FIG. 10 to 14 are sectional views to show the processing sequences in order to describe the first preferred embodiment of the tungsten plug formation process according to the method of manufacturing semiconductor devices of the present invention. These drawings show the tungsten plug formation and the formation process of an align mark during the tungsten plug formation. A cell portion (C) for the formation of the circuit patterns and a peripheral portion (P) for the formation of the align mark are shown.

Figure 10:
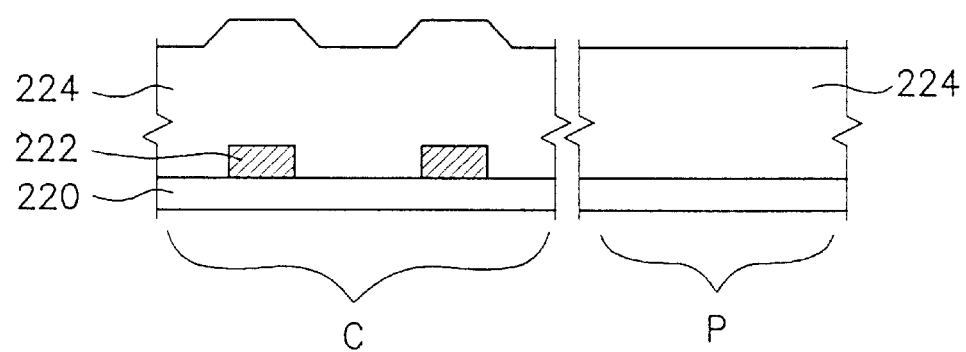
FIG. 10 to 15 are cross sectional views showing the processing sequences used to describe as first preferred embodiment of a tungsten plug formation process.

Referring to FIG. 10, in the step of forming an oxide film 224 as an insulating layer, on the semiconductor substrate 220, an oxide film 224 is formed on the semiconductor substrate 220, which has a plurality of local patterns 222 pre-formed with a certain distance apart from each other. The local pattern 222 is preferably a polysilicon pattern or a metal pattern used as a conductive layer. The oxide film 224 can be a silicon dioxide film ($SiO_2$), which is formed by typical Chemical Vapour Deposition (CVD). Typically, Phosphosilicate (PSG) or Borophosphosilicate (BPSG) are used as insulating layer between the polysilicon pattern and the metal film. The thickness of the oxide film 224 is preferably 4000 to 15000 Å. On the peripheral portion (P) for the formation of the align mark (not shown), the oxide film 224 is formed directly over the substrate 220.

Figure 11:
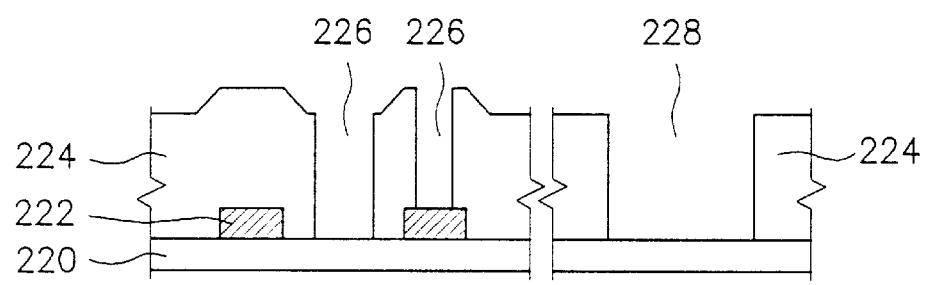

Referring to FIG. 11, in the step of forming contact hole 226 on the oxide film 224 so as to expose the local pattern 222 and the semiconductor substrate 220. The photoresist (not shown) is then coated on the oxide film 224 and the contact holes 226 are formed by carrying out an exposure process and an etch process for the local pattern 222 and the semiconductor substrate 220 via a typical photolithography and etch process. At this time, a contact hole having a bigger diameter than that of the contact hole 226 to form the align mark 228 is formed.

Figure 12:
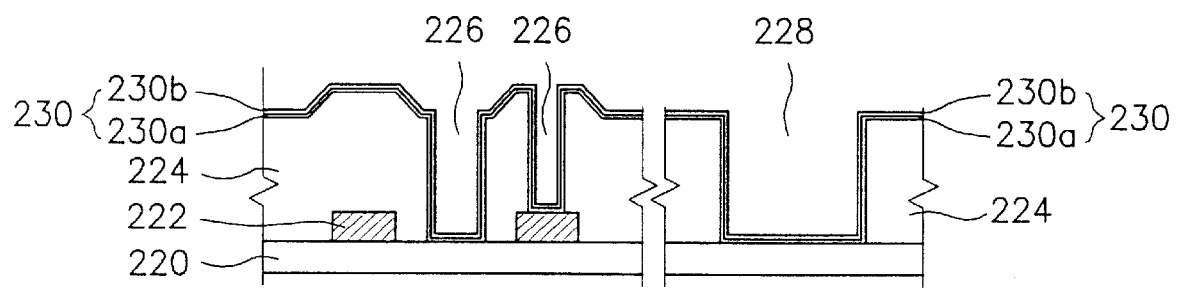

Subsequently, referring to FIG. 12, in the step of forming a barrier metal film 230 inside the contact hole 226 and on the oxide film 224, Ti/TiN preferably at a thickness of (700/700 Å) is formed in the contact hole 226 as barrier metal film 230 before forming the tungsten film. The formation of the TiN (230a) preferably uses a typical sputtering technique. In addition, the formation of the TiN (230b) preferably uses a typical sputtering or CVD technique, and is not limited to either method.

The barrier metal film 230 decreases the contact resistance of the tungsten film, and improves the adhesiveness of the tungsten film and the oxide film 224. In addition, the barrier metal film 230 can be used as stopper layer during the removal of the tungsten film in the following process. At this time, the barrier metal film 230 is formed inside the align mark 228.

Figure 13:
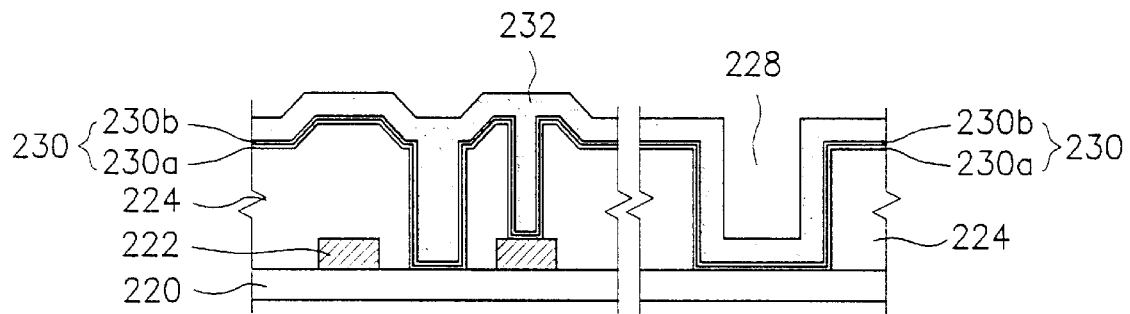

Subsequently, referring to FIG. 13, in the step of forming a first tungsten film 232 on the contact hole 226, a first tungsten film 232, preferably having a thickness of 4000 to 7000 Å, is formed burying the contact hole 226.

The contact hole 226 is filled with the first tungsten film 232, and a portion of the first tungsten film 232 is formed over the contact hole 226 and the oxide film 224, burying the contact hole 226. At this time, the first tungsten film 232 is formed inside the align mark 228. However, since the align mark 228 has a bigger diameter than that of the contact hole 226 of the cell portion (C), the align mark 228 only has its bottom and sidewalls covered with the first tungsten film 232.

Figure 14:
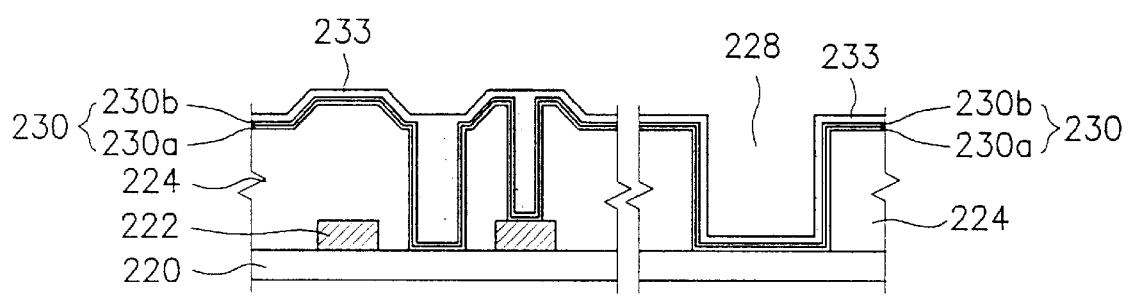

Subsequently, referring to FIG. 14, in the step of forming the second tungsten film 233 by etching a certain thickness of the first tungsten film 232, the semiconductor substrate 220 having the first tungsten film 232 is placed on a spin chuck 212, such as the one shown in the FIG. 9, and the first tungsten film 232 is etched by rotating the spin chuck 212, and spraying the etching composition through a nozzle 214, on to the semiconductor substrate 220 having the first tungsten film 232. In this process, the etching composition preferably comprises $HNO_3$ as an oxidant, and a 0.01 to 3.0 mole ratio of HF as an enhancer, and most preferably, comprises $HNO_3$ as an oxidant, and a 0.05 to 2.0 mole ratio of HF as an enhancer, with a spray rate of 0.1 to 2.5 l/min. At this time, the processing temperature is preferably from 20 to 90° C., the rotation speed of the spin chuck 212 is preferably in the range of from 200 to 5000 rpm, and the etch rate of the first tungsten film 232 is preferably in the range of from 400 to 9000 Å/min. The processing time is different depending upon the thickness of the first tungsten film 232, and can be adjusted according to the processing conditions. The etch thickness of the first tungsten film 232 is preferably 40 to 95% of the initial thickness of the first tungsten film 232.

Figure 15:
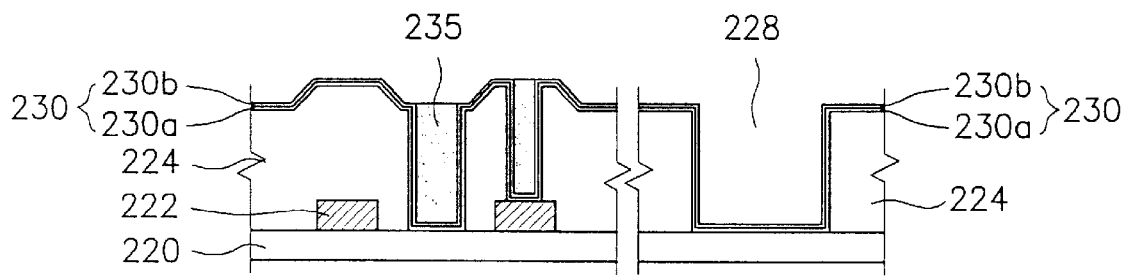

Subsequently, referring to FIG. 15, the step of the formation of the tungsten plug 235 by removing the second tungsten film 233 remaining on the barrier metal film 230 by etching is shown. In this step, the semiconductor substrate 220 having the second tungsten film 233 remaining on the barrier metal film 230 is placed on a spin chuck 212, such as the one shown in the FIG. 9, and the remaining second tungsten film 233 is etched so as to form a tungsten plug 235 by rotating the spin chuck 212 and spraying the etching composition through a nozzle 214. Preferably, the etching composition comprises $H_2O_2$ as an oxidant, and a 0 to 30 mole ratio of $NH_4OH$ as an enhancer, and most preferably comprises $H_2O_2$ as an oxidant, and a 0 to 15 mole ratio of $NH_4OH$ as an enhancer, with a spray rate of preferably 0.1 to 2.5 l/min.

At this time, the processing temperature is preferably in the range of from 20 to 90° C., and the rotation speed of the spin chuck 212 is preferably in the range of from 200 to 5000 rpm.

The etch rate of the etching composition is preferably in the range of from 200 to 3000 Å/min. The processing time varies according to the thickness of the remaining second tungsten film 233, and can be adjusted according to the processing conditions. At this time, the second tungsten film 233 inside the align mark 228 can be removed by the spin-etch. Since the size of the align mark 228 is bigger than the contact hole of the tungsten plug 235, the etching composition goes into the align mark 228 sufficiently to remove the second tungsten film 233.

As above, the tungsten plug formation process is divided into two steps, that is, the etching composition comprising HF and $HNO_3$ having a high etch rate is used so as to etch 40 to 95% of the thickness of the first tungsten film 232 in the first step. Then, the etching composition comprising $H_2O_2$ and $NH_4OH$ having a lower etch rate is used to etch the remaining portion of the second tungsten film 233 on the barrier metal film 230.

As a result, the tungsten plug 235 is formed so that the tungsten film exists only inside the contact hole 226 by contacting with the contact hole 226. In addition, in order to form the tungsten plug 235, the removal of the first tungsten film 232 can be carried out through the use of multiple steps.

The above tungsten plug formation method is characterized in that it carries out the grinding process by using the etching composition having a good reaction with metal films, and the high rotatability of the semiconductor substrate so as to etch by increasing the etch momentum in the horizontal direction of the semiconductor substrate by means of centrifugal force by the high rotation of the semiconductor substrate. This differs from the conventional CMP method in which a polishing apparatus is contacted with a semiconductor substrate with application of a certain pressure and the supply of a slurry.

In the present invention, metal films of the hole pattern portion having over 4 times the size of the metal film making various uneven patterns on the align mark and scribe line are removed in this etch. Furthermore, the generation of particles in later processes is prevented, and alignability is improved, which is shown in the only present invention as characteristics identified with the conventional method. In addition, microscratches on the semiconductor substrate and breakage of the semiconductor substrate are prevented.

In addition, the characteristics of the etch can be changed by adjusting the rotation of the semiconductor substrate, varying the supply amount of the etching composition, changing the spray pressure, altering the boom swing of the nozzle, etc.

In addition, a good tungsten plug is formed without the planarization of the intermediate insulating layers unlike the conventional one, which improves productivity, and makes possible the formation of the multi-structure.

Figure 16:
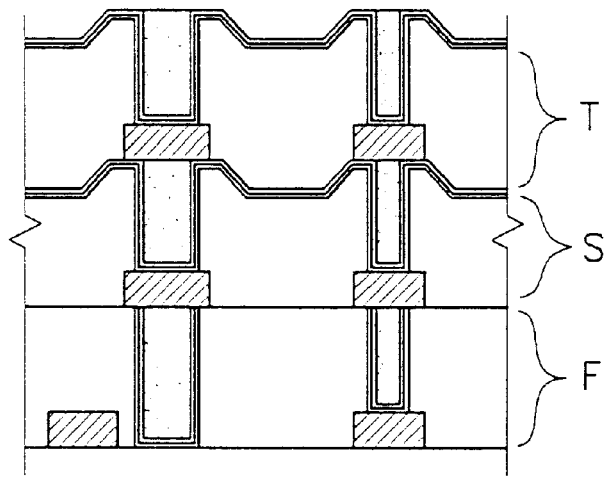
FIG. 16 is a cross sectional view showing a multi-structure created according to a preferred embodiment of the method of manufacturing semiconductor devices of the present invention.

FIG. 16 is a cross sectional view showing a multi-structure created according to the method of manufacturing semiconductor devices of the first preferred embodiment the present invention. As shown in FIG. 16, a desirable multi-structure (F,S,T) can be created by repeatedly-conducting the plug formation process, which is impossible using the conventional CMP process. In other words, a second layer structure (S) is formed over a first layer structure (F), and a third layer structure (T) can be created effectively without the performance of the planarization process. Furthermore, the multi-layer structure is not limited to the three layer structure as above.

As a result of this method, the semiconductor device fabrication process is simplified, thereby improving the productivity.

Second Preferred Embodiment

Now with the high-integration of semiconductor devices, the depth of contact holes is increasing, and the diameter of the holes is decreasing so that it is more difficult to bury the contact holes with thin films. Therefore, a pad should be formed on the portion where contact holes are formed so as to lessen the depth of the contact holes and improve the profile of the contact holes.

The method of manufacturing semiconductor devices of the present invention comprises the steps of forming a polysilicon film having a certain thickness on an insulating layer and burying contact holes formed in the insulating layer constituting a specific semiconductor structure; and spin-etching the polysilicon film using a certain etching composition such that the polysilicon film is present only inside the contact holes and does not exist on the insulating film.

The contact hole is formed on a certain conductive layer on a semiconductor substrate, or is directly formed on a semiconductor substrate.

The etching composition preferably comprises at least one oxidant selected from the group consisting of $H_2O_2$, $O_2$, $IO_4^-$, $BrO_3$, $ClO_3$, $S_2O_8^-$, $KIO_3$, $H_5IO_6$, KOH, and $HNO_3$, at least one enhancer selected from the group comprising HF, $NH_4OH$, $H_3PO_4$, $H_2SO_4$, and a HCl, and buffer solution by mixing them at certain rates.

The etching composition preferably comprises $HNO_3$ as an oxidant, and a 0.001 to 2.0 mole ratio of HF as an enhancer, and most preferably, the etching composition comprises HNO₃ as an oxidant, and a 0.005 to 0.05 mole ratio of HF as an enhancer.

The etch rate of the etching composition for the polysilicon film is preferably in the range of 1000 to 15000 Å/min.

The processing temperature of the etching composition during the spin-etching step is preferably in the range of 20 to 90° C., and the spin etch is preferably carried out by a spin-spray method.

The spray amount of the etching solution is preferably about 0.1 to 2.5 l/min, and the boom swing of a nozzle for spraying the etching composition is preferably in the range of −80 to 80.

The rotation speed of the spin chuck used in the spin-spray method is preferably in the range of 200 to 5000 rpm.

FIG. 17 to 21 are cross sectional views to show the cell-pad formation process with the polysilicon plug according to the method of manufacturing semiconductor devices of a second preferred embodiment of the present invention.

Figure 17:
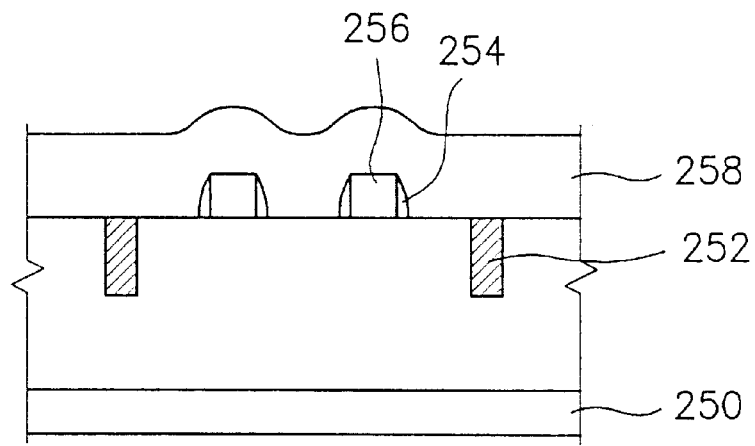
FIG. 17 to 21 are cross sectional views showing the cell-pad formation process with the polysilicon plug according to a preferred embodiment of the method of manufacturing semiconductor devices of the present invention.

First, referring to FIG. 17, in the step of forming a first insulating film 258 on a gate-electrode 256 on a semiconductor substrate 250, the first insulating film 258 is formed over a plurality of gate electrodes 256 formed on the semiconductor substrate 250 which are spaced apart from each other, and which are surrounded by spacers 254. The semiconductor substrate 250 is divided into an active region and an inactive region by a trench-isolation film 252 to isolate elements between cells. In other words, the first insulating film 258 insulates between the cell-pads when forming the cell-pad between the gate-electrode 256. The first insulating film 258 is preferably BPSG.

Figure 18:
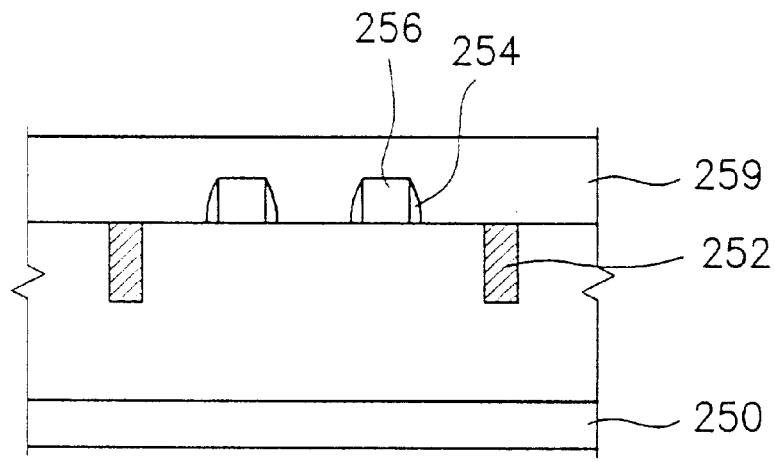

Subsequently, referring to FIG. 18, in the step of forming a second insulating film 259 by planarizing the first insulating film 258, the first insulating film 258 is planarized by a CMP process.

Figure 19:
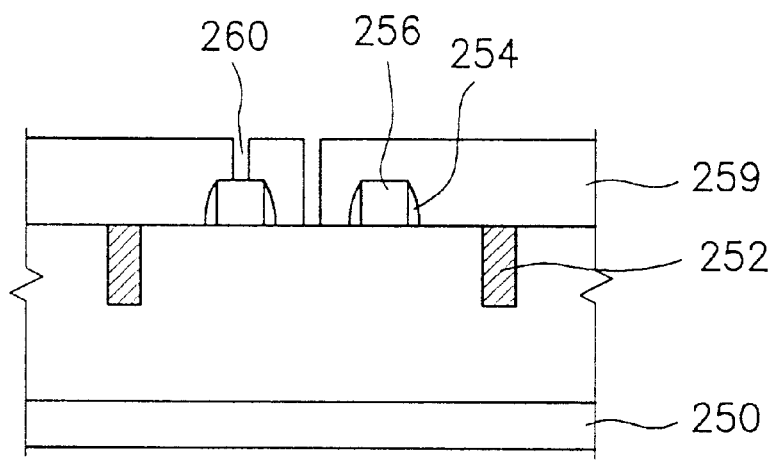

Next, referring to FIG. 19, in the step of forming contact holes 260 in the planarized second insulating film 259, the contact holes 260 are formed on the planarized second insulating film 259 so as to expose the gate electrode 256 and the semiconductor substrate 250. In this process, a photoresist (not shown) is deposited on the planarized second insulating film 259, a photoresist pattern is formed by carrying out typical photolithography process, and the contact holes 260 are formed by using the photoresist pattern as etch mask.

Figure 20:
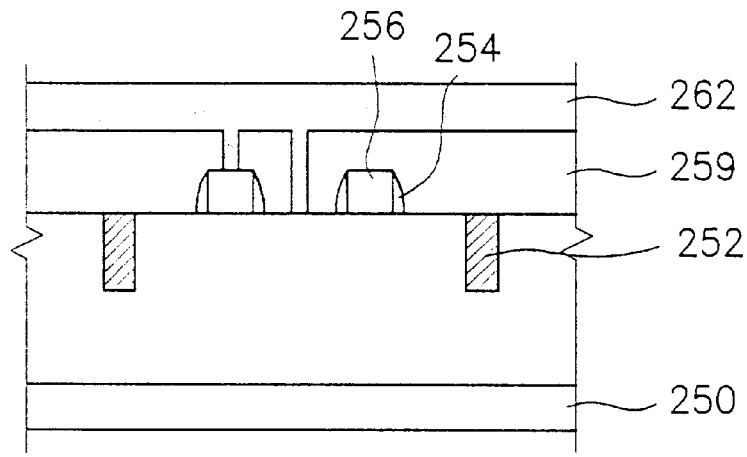

Subsequently, referring to FIG. 20, in a step of forming polysilicon film 262 on the contact holes 260, a polysilicon film 262 is formed over the second insulating film 259 at a certain thickness burying the contact hole 260.

Figure 21:
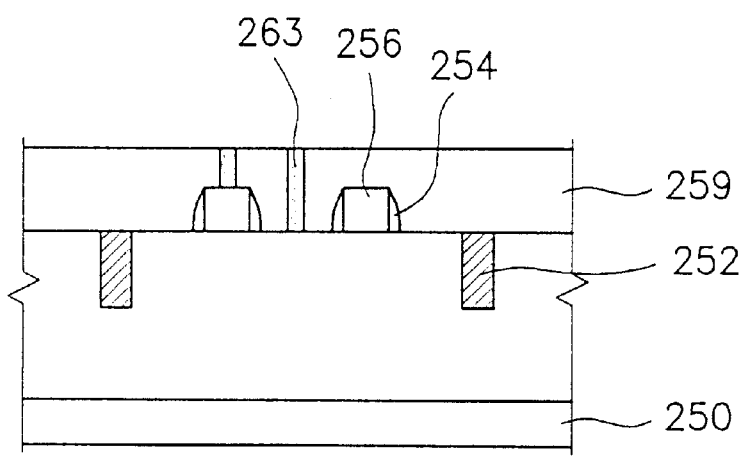

Next, referring to FIG. 21, in the step of forming a polysilicon plug 263 by spin-etching the polysilicon film 262, the polysilicon film 262 on the insulating film 258 is spin-etched by using an etching composition. Preferably, the etching composition comprises HNO₃ as an oxidant, and a 0.001 to 2.0 mole ratio of HF as an enhancer, and more preferably, the etching composition comprises HNO₃ as an oxidant, and a 0.005 to 0.05 mole ratio of HF as an enhancer. By this method, the upper surface of the second insulating film 259 is exposed, and the polysilicon film 262 remains only inside the contact holes 260.

The semiconductor substrate 250 having the polysilicon film 262 formed thereon is preferably placed on the spin chuck, and the etching composition comprising HNO₃ as an oxidant, and a 0.005 to 0.05 mole ratio of HF as an enhancer, is sprayed on the surface of the semiconductor substrate 250 while rotating the spin chuck at a certain speed so as to etch the polysilicon film 262.

The processing temperature of the etching composition is preferably in the range of from 20 to 90° C., and the spin etch is preferably carried out by a spin-spray method.

The spray amount of the etching solution is preferably about 0.1 to 2.5 l/min, and the boom swing of a nozzle for spraying the etching composition preferably moves in the range of from −80 to 80.

The rotation speed of the spin chuck used in the spin-spray method is preferably in the range of from 200 to 5000 rpm.

The etch rate of the etching composition for the polysilicon film 262 is preferably in the range of from 1000 to 15000 Å/min. The processing time varies according to the thickness of the polysilicon film 262, and can be adjusted according to the processing conditions.

The polysilicon plug 263 formed as above serves as cell-pad in later processes.

Third Preferred Embodiment

With the high-integration and multi-layered structure of semiconductor devices, the step-height difference between the cell portion for the formation of element pattern and the peripheral portion between the cell portions is increasing. Therefore, it is difficult to obtain precise pattern formation because of the difficulties in accurately focusing between the upper position and the lower position for exposure in the photolithography process with the increased step-height difference. Therefore, planarization technology is becoming increasingly important to minimize the step-height difference.

In a third preferred embodiment of the present invention, for minimizing the step-height difference, the method of manufacturing semiconductor devices of the present invention comprises steps of: forming a thicker intermediate insulating film on the lower structure having a certain step-height difference than the step-height difference of the lower structure; and planarizing by spin-etching the intermediate insulating film using a certain etching composition. The intermediate insulating film can be an oxide film.

The etching composition comprises at least one oxidant selected from the group comprising H₂O₂, O₂, IO₄⁻, BrO₃, ClO₃, S₂O₈⁻, KlO₃, H₅IO₆, KOH, and HNO₃, at least one enhancer selected from the group comprising HF, NH₄OH, H₃PO₄, H₂SO₄, and HCl, and a buffer solution by mixing them at certain rates. The etching composition preferably comprises HNO₃ as an oxidant, and a 0.01 to 3.0 mole ratio of HF as an enhancer, and more preferably the etching composition comprises HNO₃ as an oxidant, and a 0.05 to 1.0 mole ratio of HF as an enhancer.

The etch rate of the etching composition for the oxide film is preferably in the range of from 1000 to 25000 Å/min.

The processing temperature of the etching composition during the spin-etching step is in the range of from 20 to 90° C., and the spin etch is preferably carried out by a spin-spray method.

The spray amount of the etching solution is preferably about 0.1 to 2.5 l/min, and the boom swing of a nozzle for spraying the etching composition preferably moves in the range of from −80 to 80. The rotation speed of the spin chuck used in the spin-spray method is preferably in the range of from 200 to 5000 rpm.

FIG. 22 to 26 are cross sectional views to show the planarization process according to the method of manufacturing semiconductor devices of a third embodiment of the present invention.

Figure 22:
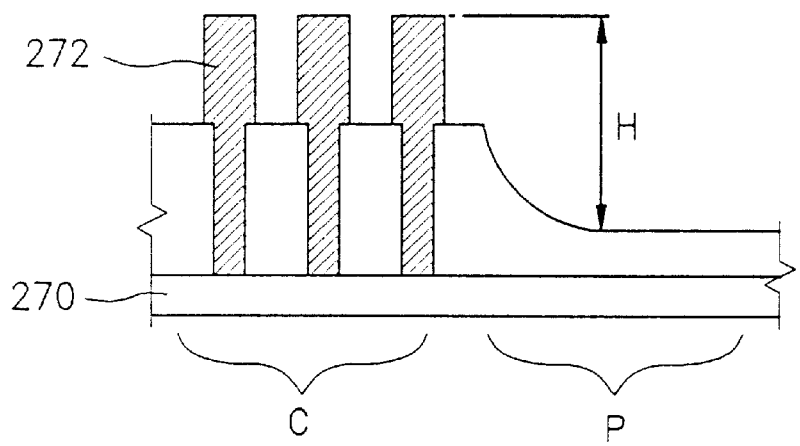
FIG. 22 to 26 are cross sectional views showing the planarization process according to a preferred embodiment the method of manufacturing semiconductor devices of the present invention.

FIG. 22, shows the step-height difference of a semiconductor device having a capacitor electrode 272 on a semiconductor substrate 270. A step-height difference (H) exists between the cell portion (C) for the element pattern and the peripheral portion (P). Because of this step-height difference, after the formation of the intermediate insulating film in a later process, malfunctions often occur because it is difficult to achieve an exact focus for satisfying the upper position and the lower position of the step-height simultaneously in a photolithography process for the formation of the element pattern on the intermediate insulating film.

Figure 23:
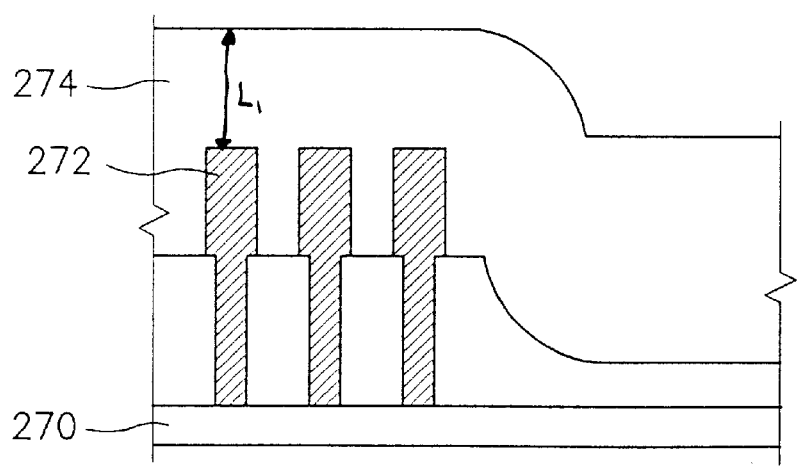

FIG. 23 is a cross sectional view showing that a first oxide film 274 as an intermediate insulating film is formed over a semiconductor substrate 270, the first oxide film being thicker than the step-height difference (H) of the semiconductor substrate 270. In other words, the first oxide film 274 is formed with a thickness large enough to offset the step-height difference (H).

The first oxide film 274 is preferably BPSG, but it is not limited to this. The BPSG is preferably formed by CVD, and more preferably by Lower Pressure Chemical Vapor Deposition (LPCVD). In this way, an uniform film can be achieved.

Figure 24:
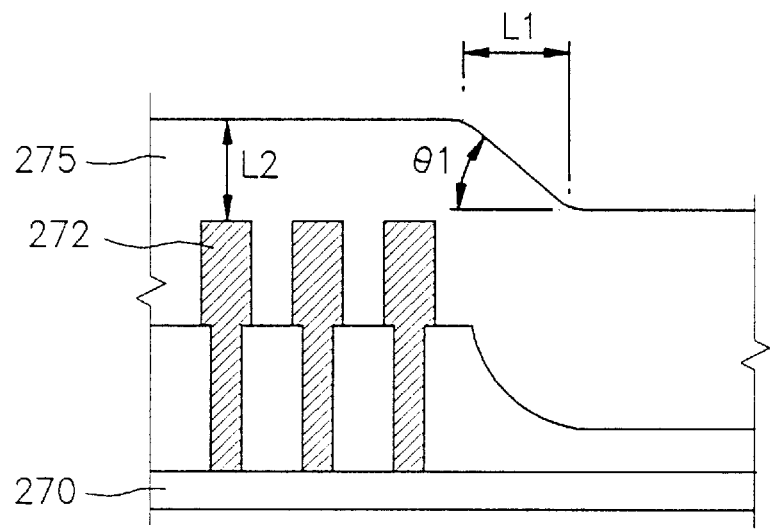

FIG. 24 is a cross sectional view showing that a second oxide film 275 is formed from a flow-planarized first oxide film 274. The first oxide film 274 is flow-planarized at a high temperature preferably over 750° C. to minimize the step-height difference. The thickness (L2) of the second oxide film 275 of the cell portions (C) is smaller than that of the first oxide film 274, (L1 from FIG. 23) and the angle (θ1) for the formation of the step-height difference is small. However, this king of a high-temperature flow planarization has a limitation.

FIG. 24 is a cross sectional view showing that a third oxide film 276 is formed by planarizing the flow-planarized second oxide film 275 using a spin-etch method. A semiconductor substrate 270 having the flow-planarized second oxide film 275 is placed on a spin chuck 212 such as the one shown in FIG. 9. Then, the spin-chuck 212, is rotated and the etching composition is sprayed through the nozzle. Preferably the etching composition comprising $HNO_3$ as an oxidant, and a 0.01 to 3.0 mole ratio of HF as an enhancer, and more preferably the etching composition comprises $HNO_3$ as an oxidant, and a 0.05 to 1.0 mole ratio of HF as an enhancer.

Preferably a spray amount of the etching solution through nozzle is about 0.1 to 2.5 l/min so that the second oxide film 275 is planarized. At this time, the processing temperature of the etching composition is preferably in the range of from 20 to 90° C., and the rotation speed of the spin chuck used in the spin-spray method is preferably in the range of from 200 to 5000 rpm. The etch rate of the etching composition for the oxide film is preferably in the range of from 1000 to 25000 Å/min.

The processing time varies according to the thickness of the second oxide film 275, and can be adjusted according to the processing conditions.

Figure 25:
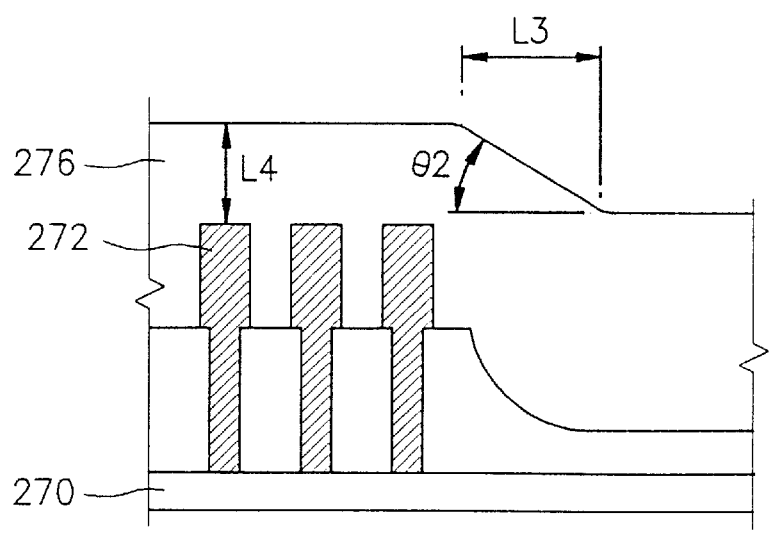

As a result, comparing the third oxide film 276 shown in FIG. 25, which is planarized by the spin-etch, with the second oxide film 275 of the FIG. 24, L1<L3 and θ1>θ2. Thus, the step-height difference is minimized by carrying out the planarization by the spin-etch.

The step-height difference can be further minimized when the rotation speed of the spin-chuck is increased and θ2 is made smaller. The rotation speed has a limitation, however, and so, the increase range of the rotation speed is confined within the sufficient reaction of the etching composition and the oxide film. The thickness of the oxide film removed by the wet-etch is (L2–L4).

Figure 26:
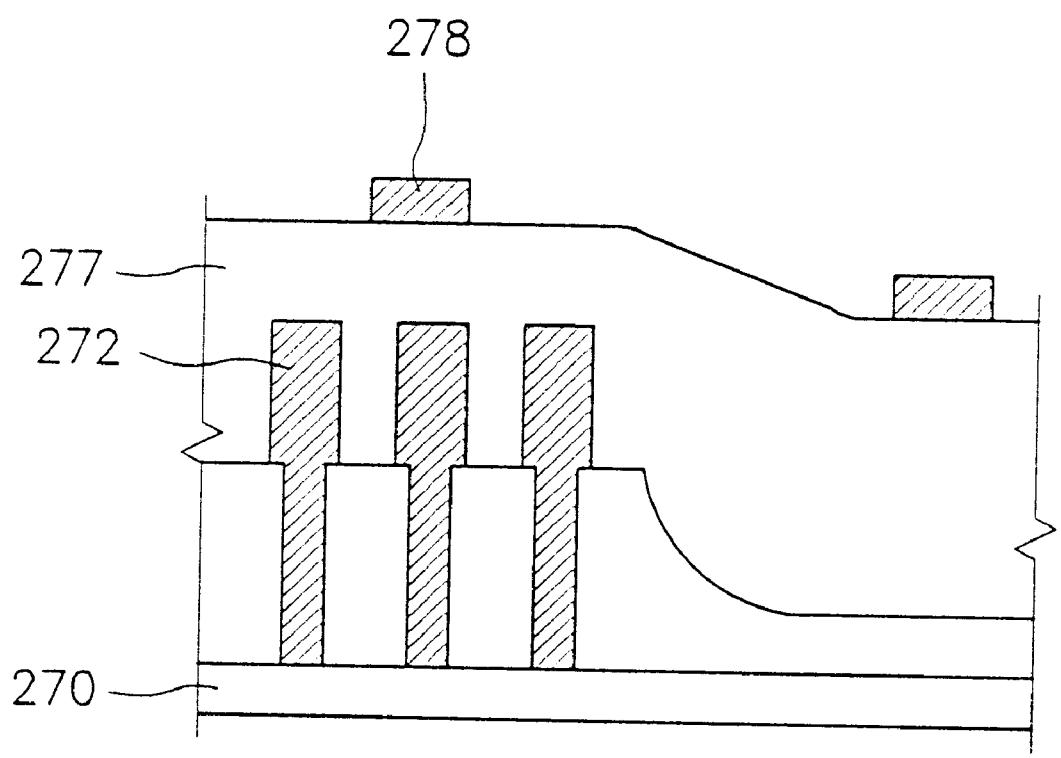

FIG. 26 is a cross sectional view showing that a photoresist pattern 278 is formed on the third oxide film 276 which is planarized by the spin-etch. The photoresist pattern 278 is formed after depositing photoresist on the third oxide film 276, and carrying out a photolithography process.

Therefore, by minimizing the step-height difference (H) between the upper position and the lower position of the first oxide film 274, the Depth Of Focus (DOF) in the following photolithography process can be improved.

Studying the effects of the present invention as shown in the first embodiment, the second embodiment, and the third embodiment, shows several improvements. In the conventional CMP method for minimizing the step-height difference of the metal film plug, the polysilicon film plug, and the intermediate insulating film, the semiconductor substrate is contacted with a polishing pad and a slurry is supplied while the polishing apparatus is rotated so that the semiconductor substrate is physically and chemically polished. In comparison, the present invention employs a certain etching composition and carries out a spin-etch method, thereby simplifying the processing and saving the processing expenses by using the less-expensive facility and the etching composition.

In addition, the present invention provides a tungsten plug which is good enough even without the planarization of the insulating film during the formation of the tungsten plug thereby improving the productivity.

Since the tungsten film of the hole-pattern portions has a size over 4 times the thickness of the tungsten film on the intermediate insulating layer, various uneven pattern on the align mark and the scribe line are all removed during the etch process. Furthermore, particle generation in later processes and the occurrence of the microscratches on the semiconductor substrate by the slurry are all prevented, and the alignability is improved. In addition, according to the present invention, the etch properties can be easily changed by adjusting the rotation speed of the semiconductor substrate, the supply amount of the etching composition, the spray pressure, and the change of the boom swing of the nozzle.

Therefore, according to the present invention, the simplification of the semiconductor device fabrication process, the increased reliability of the semiconductor devices, and the saving of the processing expenses are all achieved.

Additional advantages and modifications will readily occur to those skilled in the art. Therefore, the invention in its broader aspects is not limited to the specific details, and representative devices, shown and described therein. Accordingly, various modifications may be made without departing from the spirit or scope of the general inventive concept as defined by the appended claims and their equivalents.

What is claimed is:

1. A method of manufacturing semiconductor devices comprising the steps of:

forming an insulator film over a semiconductor substrate;

forming one or more first contact holes in the insulator film;

forming a second contact hole having a second diameter larger than a first diameter of the one or more first contact holes;

forming a tungsten film over the insulating layer, in the one or more contact first hole, and in the second contact hole; and spin-etching the tungsten film using an etching composition to remove a portion of the tungsten film from inside of the second contact hole.

2. The method of manufacturing semiconductor devices of claim 1, wherein the one or more contact holes are formed over a conductive layer formed on the semiconductor substrate.

3. The method of manufacturing semiconductor devices of claim 1, wherein the one or more contact holes are formed directly over the semiconductor substrate.

4. The method of manufacturing semiconductor devices of claim 1, further comprising a step of forming a barrier metal film over the insulating layer and the semiconductor structure, including the one or more contact holes, before the step of forming a tungsten film.

5. The method of manufacturing semiconductor devices of claim 4, wherein the barrier metal film is one of the group of Ti, TiN, and Ti/TiN.

6. The method of manufacturing semiconductor devices of claim 1, wherein the etching composition comprises at least one oxidant selected from the group consisting of $H_2O_2$, $O_2$, $IO_4^-$, $BrO_3$, $ClO_3$, $S_2O_8^-$, $KlO_3$, $H_5IO_6$, KOH, and $HNO_3$, at least enhancer selected from the group consisting of HF, $NH_4OH$, $H_3PO_4$, $H_2SO_4$, and HCl, and a buffer solution.

7. The method of manufacturing semiconductor devices of claim 6, wherein the etching composition comprises $HNO_3$ as an oxidant and a 0.01 to 3.0 mole ratio of HF as an enhancer.

8. The method of manufacturing semiconductor devices of claim 7, wherein the etch rate of the etching composition is in the range of 400 to 9000 Å/min.

9. The method of manufacturing semiconductor devices of claim 7, wherein the etching composition comprises $HNO_3$ as an oxidant and a 0.05 to 2.0 mole ratio of HF as an enhancer.

10. The method of manufacturing semiconductor devices of claim 6, wherein the etching composition comprises $H_2O_2$ as an oxidant and a 0 to 30 mole ratio of $NH_4OH$ as an enhancer.

11. The method of manufacturing semiconductor devices of claim 10, wherein the etch rate of the etching composition is in the range of 200 to 3000 Å/min.

12. The method of manufacturing semiconductor devices of claim 10, wherein the etching composition comprises $H_2O_2$ as an oxidant and a 0 to 15 mole ratio of $NH_4OH$ as an enhancer.

13. The method of manufacturing semiconductor devices of claim 6, wherein the processing temperature of the etching composition during the spin-etching step is in the range of 20 to 90° C.

14. The method of manufacturing semiconductor devices of claim 1, wherein the spin etch step is carried out by a spin-spray method.

15. The method of manufacturing semiconductor devices of claim 14, wherein the spray amount of the etching solution is in the range of 0.1 to 2.5 l/min.

16. The method of manufacturing semiconductor devices of claim 14, wherein the boom swing of a nozzle for spraying the etching composition is in the range of from –80 to 80.

17. The method of manufacturing semiconductor devices of claim 14, wherein the rotation speed of a spin chuck used in the spin-spray method is in the range of 200 to 5000 rpm.

18. The method of manufacturing semiconductor devices of claim 1, wherein the spin-etching step is performed in at least two separate steps.

19. A method of manufacturing semiconductor devices comprising the steps of:

forming an insulator film over a semiconductor substrate;

forming one or more first contact holes in the insulator film;

forming a second contact hole having a second diameter larger than a first diameter of the one or more first contact holes;

forming a tungsten film over the insulating layer, in the one or more first contact holes, and in the second contact hole;

carrying out a first spin-etching of the tungsten film to remove 40 to 95% of the thickness of the tungsten film by using a first etching composition having a high etch rate; and carrying out a second spin-etching of the tungsten film to remove an additional portion of the tungsten film from inside of the second contact hole, by using a second etching composition having a lower etch rate than the first etching composition.

20. A method of manufacturing semiconductor devices comprising the steps of:

forming an insulating layer film over a semiconductor substrate;

forming one or more first contact holes in the insulating layer;

forming a second contact hole having a second diameter larger than a first diameter of the one or more first contact holes;

forming a polysilicon film over the insulating layer, in the one or more contact holes, and in the second contact hole; and spin-etching the polysilicon film using an etching composition to remove a portion of the polysilicon film from inside of the second contact hole.

21. The method of manufacturing semiconductor devices of claim 20, wherein the one or more contact holes are formed over a conductive layer formed on the semiconductor substrate.

22. The method of manufacturing semiconductor devices of claim 20, wherein the one or more contact holes are formed directly over the semiconduct or substrate.

23. The method of manufacturing semiconductor devices of claim 20, wherein the etching composition comprises at least one oxidant selected from the group consisting of $H_2O_2$, $O_2$, $IO_4^-$, $BrO_3$, $ClO_3$, $S_2O_8^-$, $KlO_3$, $H_5IO_6$, KOH, and $HNO_3$, at least one enhancer selected from the group consisting of HF, $NH_4OH$, $H_3PO_4$, $H_2SO_4$, and HCl, and a buffer solution.

24. The method of manufacturing semiconductor devices of claim 23, wherein the etching composition comprises $HNO_3$ as an oxidant and a 0.001 to 2.0 mole ratio of HF as an enhancer.

25. The method of manufacturing semiconductor devices of claim 24, wherein the etch rate of the etching composition is in the range of 1000 to 15000 Å/min.

26. The method of manufacturing semiconductor devices of claim 24, wherein the etching composition comprises $HNO_3$ as an oxidant and a 0.005 to 0.05 mole ratio of HF as an enhancer.

27. The method of manufacturing semiconductor devices of claim 20, wherein the processing temperature of the etching composition during the spin-etching step is in the range of 20 to 90° C.

28. The method of manufacturing semiconductor devices of claim 20, wherein the spin-etch step is carried out by a spin-spray method.

29. The method of manufacturing semiconductor devices of claim 28, wherein the spray amount of the etching solution is in the range of 0.1 to 2.5 l/min.

30. The method of manufacturing semiconductor devices of claim 28, wherein the boom swing of a nozzle for spraying the etching composition is in the range of −80 to 80.

31. The method of manufacturing semiconductor devices of claim 28, wherein the rotation speed of a spin chuck used in the spin-spray method is in the range of 200 to 5000 rpm.

32. A method of manufacturing semiconductor devices comprising the steps of:

forming an insulator film over a semiconductor substrate;

forming one or more first contact holes in the insulator film;

forming a second contact hole having a second diameter larger than a first diameter of the one or more first contact holes;

forming a conductive film over the insulating layer, in the one or more first contact holes, and in the second contact hole; and spin-etching the conductive film using an etching composition to remove a portion of the conductive film from inside of the second contact hole.

* * * * *